United States Patent
Vo et al.

[19]

[11] Patent Number: 6,141,286
[45] Date of Patent: Oct. 31, 2000

[54] EMBEDDED DRAM ARCHITECTURE WITH LOCAL DATA DRIVERS AND PROGRAMMABLE NUMBER OF DATA READ AND DATA WRITE LINES

[75] Inventors: Huy T. Vo; Todd A. Merritt; Layne G. Bunker, all of Boise, Id.

[73] Assignee: Micron Technology, Inc., Boise, Id.

[21] Appl. No.: 09/137,526

[22] Filed: Aug. 21, 1998

[51] Int. Cl.[7] .................................................. G11C 8/00
[52] U.S. Cl. .............................. 365/230.03; 365/230.06; 365/52; 365/63
[58] Field of Search .................. 365/230.03, 230.04, 365/230.06, 63, 52, 72

[56] References Cited

U.S. PATENT DOCUMENTS

| | | | |
|---|---|---|---|
| 3,686,640 | 8/1972 | Andersen et al. | 340/172.5 |
| 4,611,299 | 9/1986 | Hori et al. | 365/219 |
| 4,618,947 | 10/1986 | Tran et al. | 365/236 |
| 4,739,497 | 4/1988 | Itoh et al. | 365/189.09 |
| 4,796,224 | 1/1989 | Kawai et al. | 365/230.03 |
| 5,042,011 | 8/1991 | Casper et al. | 365/205 |
| 5,280,205 | 1/1994 | Green et al. | 365/205 |
| 5,280,447 | 1/1994 | Hazen et al. | 365/230.03 |
| 5,305,281 | 4/1994 | Lubeck | 365/230.03 |
| 5,402,379 | 3/1995 | McClure | 365/230.03 |
| 5,506,810 | 4/1996 | Runas | 365/230.03 |
| 5,544,113 | 8/1996 | Kirihata et al. | 365/230.03 |
| 5,586,078 | 12/1996 | Takase et al. | 365/230.03 |
| 5,617,555 | 4/1997 | Patel et al. | 365/230.03 |
| 5,625,602 | 4/1997 | Hasegawa et al. | 365/222 |
| 5,627,785 | 5/1997 | Gilliam et al. | 365/189.01 |
| 5,654,932 | 8/1997 | Rao | 365/230.03 |
| 5,703,810 | 12/1997 | Nagy | 365/189.05 |
| 5,717,629 | 2/1998 | Yin | 365/230.03 |
| 5,726,931 | 3/1998 | Zagar et al. | 365/149 |
| 5,771,200 | 6/1998 | Cno et al. | 365/230.03 |
| 5,875,132 | 2/1999 | Ozaki | 365/230.03 |

FOREIGN PATENT DOCUMENTS

| | | |
|---|---|---|
| 09-17178 | 1/1997 | Japan. |
| WO 97/27592 | 7/1997 | WIPO. |

*Primary Examiner*—Tan T. Nguyen
*Attorney, Agent, or Firm*—Dickstein Shapiro Morin & Oshinsky LLP

[57] ABSTRACT

A DRAM architecture configures memory cells into a predetermined number of arrays. Each array has its own row decoders and sense amplifiers. A data path circuit containing local drivers and data read and write lines is associated with each of the arrays in a first direction. The respective connections between the array and data path circuit utilize IO lines that are considerably shorter than the IO lines used in prior art architectures. Using this unique arrangement of data path circuits and memory arrays as a building block, a DRAM architecture of increased capacity can be constructed by simply placing additional data paths and memory arrays on to the semiconductor device in a second direction orthogonal to the first direction.

70 Claims, 10 Drawing Sheets

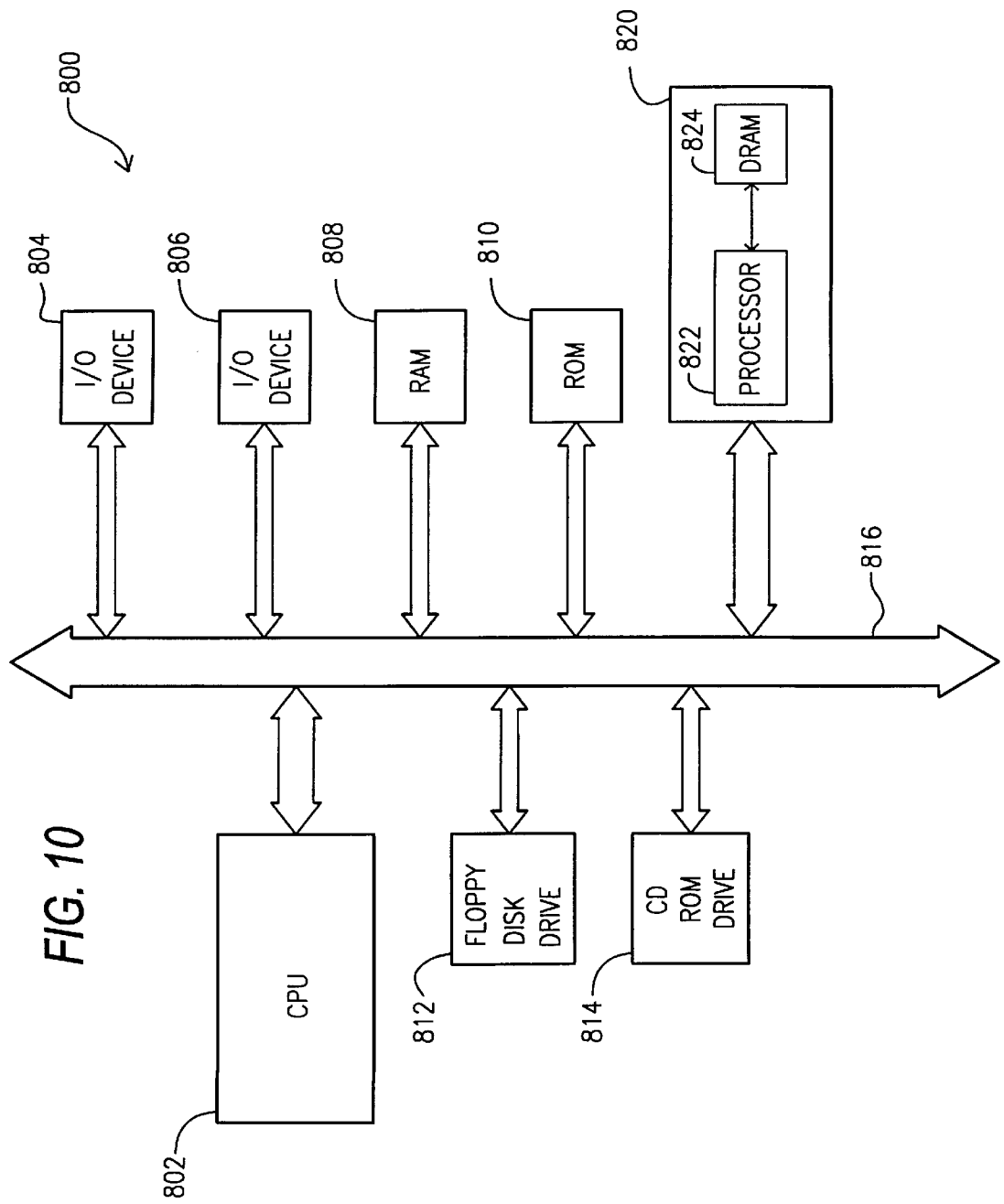

EMBEDDED DRAM ARCHITECTURE WITH LOCAL DATA DRIVERS AND PROGRAMMABLE NUMBER OF DATA READ AND DATA WRITE LINES

BACKGROUND OF THE INVENTION

1. Field of the Invention

This invention relates to semiconductor memory devices and, in particular, to dynamic random access memory devices (DRAMs) having a wide bandwidth, fast read and write access and programmable number of data read and data write lines.

2. Description of the Related Art

DRAMs contain an array of individual memory cells. Typically, each DRAM memory cell comprises a capacitor for holding a charge and an access transistor for accessing the capacitor charge. The charge is representative of a data bit and can be either high voltage or low voltage (representing, e.g., a logical "1" or a logical "0," respectively). Data can be stored in memory during write operations or read from memory during read operations.

Refresh, read, and write operations in present-day DRAMs are typically performed for all cells in one row simultaneously. Data is read from memory by activating a row, referred to as a word line, which couples all memory cells corresponding to that row to digit or bit lines which define the columns of the array. When a particular word line and bit line are activated, a sense amplifier detects and amplifies the data in the addressed cell by measuring the potential difference on the activated bit line corresponding to the content of the memory cell connected to the activated word line. The operation of DRAM sense amplifiers is described, for example, in U.S. Pat. Nos. 5,627,785; 5,280,205; and 5,042,011, all assigned to Micron Technology Inc. and incorporated by reference herein.

An embedded DRAM resides on a complex semiconductor circuit containing significant amounts of both DRAM and logic units (for example, a processor). This results in a compact design with minimal propagation distances between the logic units and the memory cells. Embedded DRAM also offers the advantages of simpler system-level design, fewer packages with fewer pins, reduced part count, and lower power consumption. This reduction in external circuit connections increases the efficiency of the DRAM and the overall logic processing device or application. For example, the bandwidth, the number of input and output pins, of the DRAM can increase because less circuitry is required to operate the DRAM. Speed also increases since the logic and control signals, as well as the input and output data, travel shorter distances.

FIG. 1 illustrates one example of a semiconductor circuit 50 having a processor 52 and embedded DRAM 54. Although a processor 52 is illustrated in FIG. 1, the circuit 50 could also utilize a co-processor or other logical device. Likewise, the circuit 50 could utilize synchronous graphic random access memory (SGRAM) instead of embedded DRAM 54. SGRAM is specifically designed for video applications but generally operates in a similar manner as the conventional embedded DRAM 54.

FIG. 2 illustrates a portion of the architecture of a conventional embedded DRAM 54. The DRAM 54 includes several arrays of memory cells 60, data path circuits 56, sense amplifier circuits 64 and row decoder circuits 66a, 66b, 66c (collectively referred to as row decoders 66). The row decoder circuits 66 are used to activate rows of memory within the arrays 60 based upon an address supplied by control logic. The middle row decoder 66b is used to activate rows in the two arrays 60 adjacent to it while the two outside row decoders 66a, 66c are used to activate rows in the single array 60 that they are adjacent to. Column select signals, also provided by control logic, are used to activate specified columns of memory within the arrays 60. The data path circuits 56 and the arrays 60 are connected (through the sense amplifier circuits 64) by numerous IO lines 62 (although only a small number of IO lines are illustrated in FIG. 2). Accordingly, data travels along the IO lines 62 between the arrays 60 and data path circuits 56.

A conventional data path circuit 56 generally includes read and write drivers and data read and data write lines. Data read lines allow the data path circuits 56 to output data read from the arrays 60 to a logical unit (e.g., the processor in FIG. 1). Data write lines allow the data path circuit 56 to input data from a logical unit and to write the data into the arrays 60. Data read and data write Lines are sometimes referred to as I/O lines, since they are usually connected to input/output pins or buffers, which are not to be confused with the IO lines 64 providing a path between the sense amplifier circuits 56 and the memory arrays 60.

Although the conventional embedded DRAM has performed well in the past, the evolution of current technology requires faster memory with larger bandwidths. The architecture illustrated in FIG. 2 utilizes very long IO lines 62 which leads to slower speeds because a longer time is required to access the individual memory cells of the array 60, particularly for memory cells located the farthest away from the data path circuits 56 because only one row at a time can be addressed for all the IO lines 62. In addition, the bandwidth of the DRAM 54 is also restricted by the use of the numerous long IO lines 62. Therefore, to accommodate today's technology, there is still a desire and need to increase the bandwidth of embedded DRAM circuits while also increasing the speed of these circuits.

Memory tests on embedded DRAM circuits are typically performed by the manufacturer during production and fabrication and also by a downstream manufacturer of a computer or processor controlled system as well as by an end-user during computer initialization to determine if the circuits are operating as intended. One conventional method of testing memory is to utilize address compression. Briefly, address compression is accomplished by treating certain addresses as "don't care" address locations. These locations correspond to specific input or output pins and are compared together with a special compare circuit. The compare circuit determines if the data from each address location is the same. If they are not the same, at least one of the address locations is defective.

Addressed compression greatly increases the speeds of the DRAM test. Unfortunately, address compression can not be fully utilized in conventional embedded DRAMs because the FIG. 2 architecture of the conventional embedded DRAM prevents the activation of more than one row of memory cells at a time per set of IO lines 62. Therefore, there is a need to enhance the testing of embedded DRAM circuits.

Since embedded DRAM circuits are usually tailored for the application or process desired, there exists a need to easily add the desired amount of data read and data write lines (I/O lines corresponding to output and input buffers and pins) for an application without a major reconfiguration of the memory circuit architecture (this addition of a number of I/O lines as desired is referred to as programmable data read and data write lines or programmable I/O's).

BRIEF SUMMARY OF THE INVENTION

This present invention alleviates to a great extent the above shortcomings of the prior art. The invention utilizes a unique embedded DRAM architecture to provide increased bandwidth, fast read and write access and programmable data read and data write lines.

The invention also provides a mechanism for testing an embedded DRAM circuit with address compression.

The DRAM architecture of the invention achieves these features and advantages and others by initially configuring memory cells into a predetermined number of arrays. Each array has its own row decoders and sense amplifiers. A data path circuit containing local drivers and data read and write lines is associated with each of the arrays in a first direction. The respective connections between the array and data path circuit utilize IO lines that are considerably shorter than the IO lines used in prior art architectures. Using this unique arrangement of data path circuits and memory arrays as a building block, a DRAM architecture of increased capacity can be constructed by simply placing additional data paths and memory arrays on to the semiconductor device in a second direction orthogonal to the first direction. This allows the DRAM circuit to be easily tailored for the application or process desired (that is, the invention has programmable data read and data write lines). In addition, the bandwidth is easily increased by incorporating more data path circuits and, accordingly, more active data read and data write lines, on the semiconductor device. In addition, faster reads and writes are achieved because of shorter IO lines between the memory cells and the logic contained within the data path circuits.

This architecture also provides a mechanism for testing a DRAM circuit with address compression since an address location from several arrays of memory (cells can be accessed in parallel for one test address.

BRIEF DESCRIPTION OF THE DRAWINGS

The foregoing and other objects and advantages of the invention will become more apparent from the detailed description of the preferred embodiments of the invention given below with reference to the accompanying drawings in which:

FIG. 10 is a block diagram of a computer system utilizing an embedded DRAM circuit constructed in accordance with the present invention.

DETAILED DESCRIPTION OF THE PREFERRED EMBODIMENTS

Figure 3:
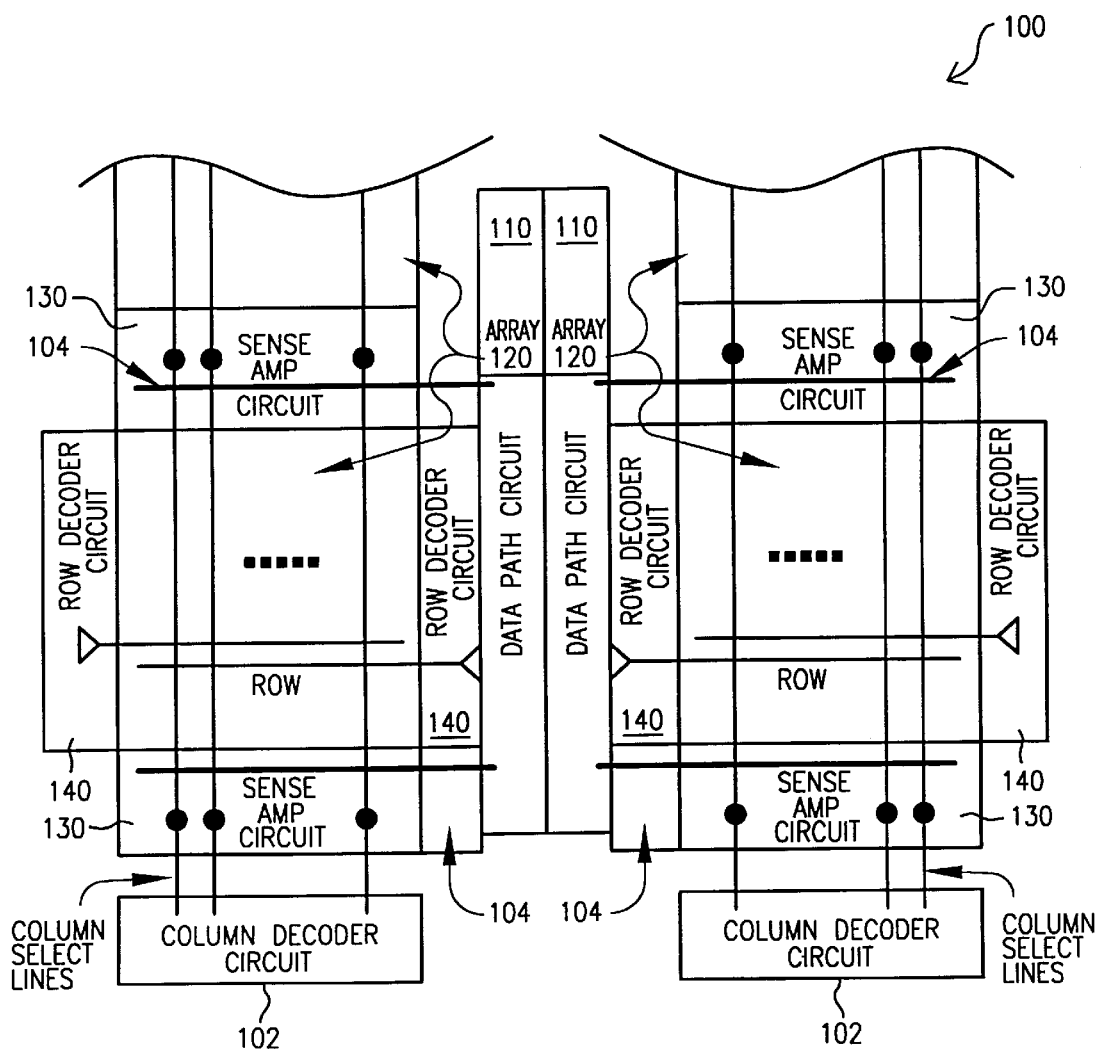
FIG. 3 is a block diagram of an embedded DRAM circuit constructed in accordance with the present invention.

FIG. 3 illustrates a portion of a DRAM architecture 100 constructed in accordance with the first embodiment of the present invention. The architecture 100 includes several arrays of memory cells 120, data path circuits 110, sense amplifier circuits 130 and row decoder circuits 140. Each array 120 has two row decoder circuits 140 and two sense amplifier circuits 130. A data path circuit 110 containing local drivers and data read and write lines is associated with each of the arrays 120 in an x-direction. The respective connections between an array 120 and a data path circuit 110 utilize IO lines 104 that are considerably shorter than the IO lines used in prior art architectures. Using this unique arrangement of data path circuits 110, memory arrays 120 in an x-direction, and their associated row decoders 140, sense amplifier circuits 130 and IO lines 104 as a building block (illustrated by dotted line 108), a DRAM architecture 100 of increased capacity can be constructed by simply placing additional data path circuits 110 and memory arrays 120 on to the semiconductor device in a y-direction. In addition, as illustrated in FIG. 3, the arrangement of data path circuits 110 and memory arrays 120 can also be replicated in the x-direction to increase the memory capacity and bandwidth of the DRAMA architecture 100. Thus, allowing the DRAM architecture 100 to be easily tailored for the application or process desired (that is, the invention has programmable data read and data write lines). The bandwidth is increased by incorporating more data path circuits 110 and, accordingly, more active data read and data write lines, on the semiconductor device. In addition, faster reads and writes are achieved because of shorter IO lines 104 between the memory cells of the arrays 120 and the logic contained within the data path circuits 110.

The arrays of memory 120 include memory cells arranged in rows and columns. For each row there is a word line and for each column there is a digit line and a complement digit line (also known as a digit line pair). As is well known in he art, and as will be described in detail with reference to FIGS. 4 and 5, the row decoders 140 activate word lines in response to a row address. The activated word line activates the access transistors for the memory cells connected to that word line allowing the charge stored on the mbit capacitors of the memory cells to discharge onto the digit lines and travel to the sense amplifier circuits 130. The column decoders 102 choose a particular column or columns by sending a column select signal to couple the sense amplifier circuitry 130 to the IO lines 104 in response to a column address. For a read operation, the data stored in the accessed memory cells of the array 120 will be output to the data path circuits 110 on the IO lines 104 from the sense amplifier circuits 130. It must be noted that each IO line 104 is actually a pair of IO lines, each line corresponding to a bit of data and its complement (hereinafter referred to as an IO pair). For a write operation, data will be input on the IO lines from the data path circuits 110, will travel through the sense amplifier circuits 130 and will be stored in the accessed memory cells of the array 120. Preferably, the size of the arrays 120 are 64K each with two arrays 120 in the x-direction forming a module of 128 k (that is, 131,072 individual memory cells generally referred to as mbits), although any size array, for example 64K, 256K, 512K or 1024K can be used for the module or array. In addition, each array can also contain redundant rows and columns and, therefore, may have more cells than its minimum operating capacity.

The sense amplifier circuits 130 are connected to the digit line pairs of the memory arrays 120. FIG. 3 illustrates the sense amplifier circuits 130 as blocks to indicate where the circuits 130 are located within the DRAM architecture 100. It must be noted that each sense amplifier circuit 130 contains a sufficient amount of individual sense amplifiers, one for each digit line pair, to properly read and amplify the data content of the memory cells within the arrays of memory 120. As will be described below, the sense amplifier circuits 130 also contain appropriate input driver circuitry for data that is to be written into the memory arrays 120 (since the individual sense amplifiers are not required to amplify the data during write operations).

Figure 4:
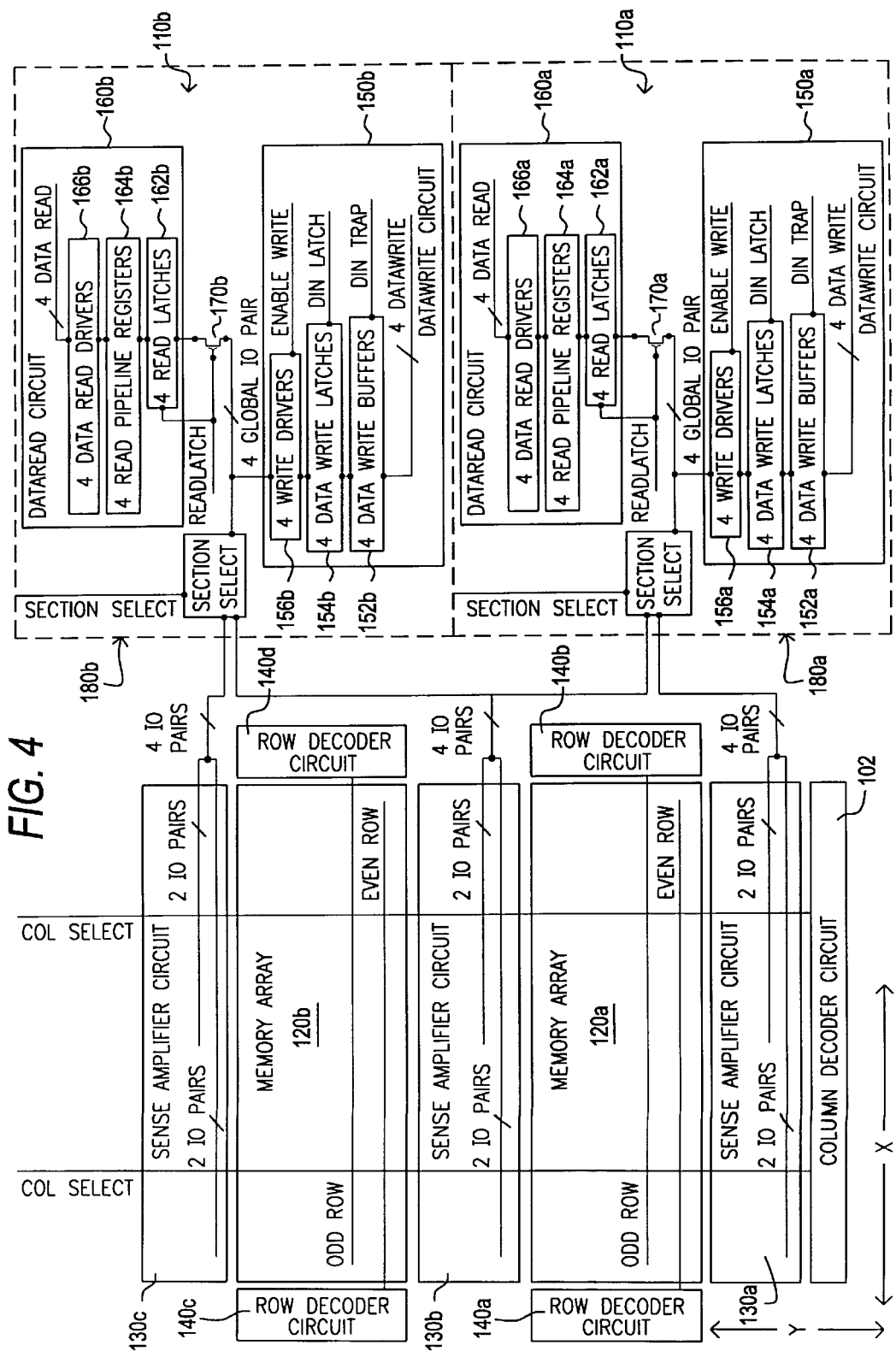
FIGS. 4 and 5 are circuit diagrams of the components comprising the DRAM circuit of FIG. 3.

FIG. 4 illustrates the contents of individual data path circuits 110*a*, 110*b* and the various connections between individual sense amplifier circuits 130*a*, 130*b*, 130*c*, row decoder circuits 140*a*, 140*b*, 140*c*, 140*d*, memory arrays 120*a*, 120*b* and data path circuits 110*a*, 110*b*. It must be noted that the individual data path circuits 110*a*, 110*b* are similar circuits (collectively referred to as data path circuits 110), but are given individual reference numerals for the purposes of this discussion. It must be noted that the individual sense amplifier circuits 130*a*, 130*b*, 130*c* are similar circuits (collectively referred to as sense amplifier circuits 130), but are given individual reference numerals for the purposes of this discussion. It must be noted that the individual row decoder circuits 140*a*, 140*b*, 140*c*, 140*d* are similar circuits (collectively referred to as row decoder circuits 140), but are given individual reference numerals for the purposes of this discussion. Likewise, the individual memory arrays 110*a*, 110*b* are similar arrays (collectively referred to as memory arrays 110).

Figure 1:
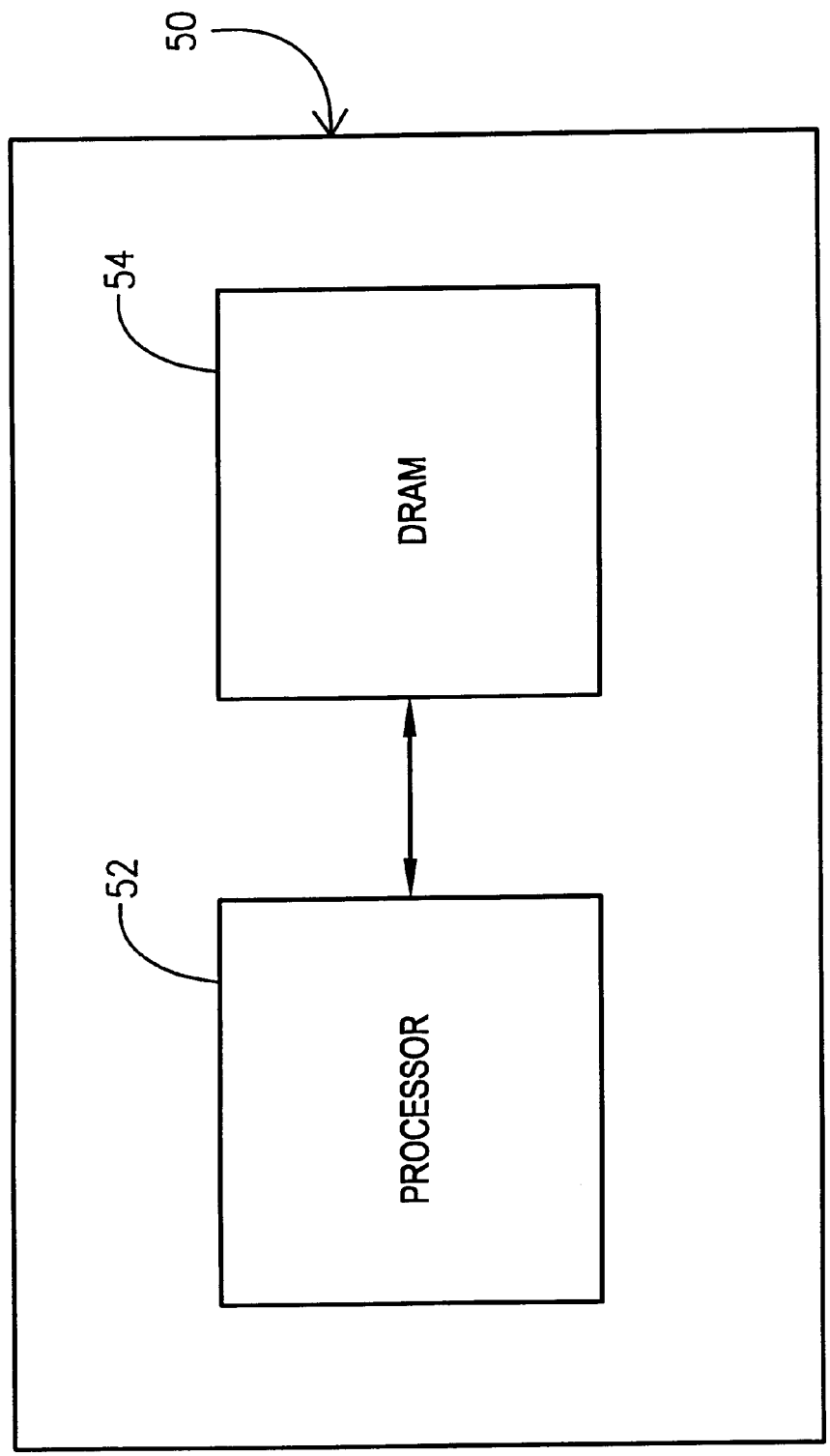
FIG. 1 is a block diagram of a semiconductor circuit having a processor and an embedded DRAM circuit.

The first data path circuit 110*a* contains a data write circuit 150*a*, data read circuit 160*a* and a section select circuit 180*a*. The data read circuit 160*a* contains a number of conventional read driver circuits 166*a* each having a corresponding data read line, a number of conventional read pipeline registers 164*a* and a number of conventional read latches 162*a*. The data read circuit 160*a* also includes a number of read IO transistors 170*a* (only one transistor 170*a* is illustrated for convenience purposes) connected to the read latches 162*a* and a read latch signal READLATCH. The read IO transistors 170*a* are also connected to the output of the section select circuit 180*a*. The data read lines are connected to output pins through output buffers of the logical unit (e.g., the processor illustrated in FIG. 1). The number of read driver circuits 166*a*, pipeline registers 164*a* and latches 162*a* may vary and is dependent upon the intended application. Preferably, there are 4 read driver circuits 166*a*, pipeline registers 164*a* and latches 162*a* and, therefore, 4 data read lines in the data read circuit 160*a*.

The data write circuit 150*a* contains a number of conventional write driver circuits 156*a* each having a corresponding data write line, a number of conventional write latches 154*a* and a number of conventional write buffers 152*a*. The write driver circuits 156*a* are connected to a write enable signal ENABLE WRITE. The output of the write driver circuits 156*a* are connected to the section select circuit 180*a*. The write latches 154*a* are connected to a data in latch signal DIN LATCH. The write buffers 152*a* are connected to a data in trip signal DIN TRAP. The data write lines are connected to input pins through input buffers of the logical unit (e.g., the processor 52 in FIG. 1). The number of write driver circuits 156*a*, latches 154*a* and buffers 152*a* may vary and is dependent upon the intended application. Preferably, there are 4 write driver circuits 156*a*, latches 154*a* and buffers 152*a* and, therefore, 4 data write lines in the data write circuit 150*a*.

The section select circuit 180*a* is connected to a number of IO lines 104*a* from the first sense amplifier circuit 130*a* and a number of IO lines 104*b* from the second sense amplifier circuit 130*b*. As stated above, each IO line 104 is actually an IO pair corresponding to a data bit and its complement. Accordingly, the number of IO pairs will match the number of data read and data write lines. The section select circuit 180*a* is also connected to a section select signal SECTION SELECT. The section select signal SECTION SELECT is connected to control logic and is used to connect either the first sense amplifier circuit 130*a* or the second sense amplifier circuit 130*b* to the first data path circuit 110*a*.

The second data path circuit 110*b* contains a data write circuit 150*b*, data read circuit 160*b* and a section select circuit 180*b*. The data read circuit 160*b* contains a number of conventional read driver circuits 166*b* each having a corresponding data read line, a number of conventional read pipeline registers 164*b*, and a number of conventional read latches 162*b*. The data read circuit 160*b* also includes a number of read IO transistors 170*b* (only one transistor 170*b* is illustrated for convenience purposes) connected to the read latches 162*b* and a read latch signal READLATCH. The read IO transistors 170*b* are also connected to the output of the section select circuit 180*b*. The data read lines are connected to output pins through output buffers of the logical unit (e.g., the processor illustrated in FIG. 1). The number of read driver circuits 166*b*, pipeline registers 164*b* and latches 162*b* may vary and is dependent upon the intended application. Preferably, there are 4 read driver circuits 166*b*, pipeline registers 164*b* and latches 162*b* and, therefore, 4 data read lines in the data read circuit 160*b*.

The data write circuit 150*b* contains a number of conventional write driver circuits 156*b* each having a corresponding data write line, a number of conventional write latches 154*b* and a number of conventional write buffers 152*b*. The write driver circuits 156*b* are connected to a write enable signal ENABLE WRITE. The output of the write driver circuits 156*b* are connected to the section select circuit 180*b*. The write latches 154*b* are connected to a data in latch signal DIN LATCH. The write buffers 152*b* are connected to a data in trap signal DIN TRAP. The data write lines are connected to input pins through input buffers of the logical unit (e.g., the processor 52 in FIG. 1). The number of write driver circuits 156*b*, latches 154*b* and buffers 152*b* may vary and is dependent upon the intended application. Preferably, there are 4 write driver circuits 156*b*, latches 154*b* and buffers 152*b* and, therefore, 4 data write lines in the data write circuit 150*b*.

The section select circuit 180*b* is connected to a number of IO lines 104*c* from the third sense amplifier circuit 130*c* and a number of IO lines 104*b* from the second sense amplifier circuit 130*b*. As stated above, each IO line 104 is actually an IO pair corresponding to a data bit and its complement. Accordingly, if the number of IO pairs will match the number of data read and data write lines. The section select circuit 180*b* is also connected to a section select signal SECTION SELECT. The section select signal SECTION SELECT is connected to control logic and is used to connect either the third sense amplifier circuit 130*c* or the second sense amplifier circuit 130*b* to the second data path circuit 110*b*.

The first memory array 120*a* is connected to the first data path circuit 110*a* through the first sense amplifier circuit 130*a* and is connected to the second data path circuit 110*b* through the second sense amplifier circuit 130*b*. The first memory array 120*a* is also connected to two row decoders 140*a*, 140*b*. The first row decoder 140*a* is an even row decoder (that is, decodes even numbered row addresses) while the second row decoder 140*b* is an odd row decoder (that is, decodes odd numbered row addresses) although any configuration of the two row decoders 140a, 140b is possible. The second memory array 120b is connected to the first data path circuit 110a through the second sense amplifier circuit 130b and is connected to the second data path circuit 110b through the third sense amplifier circuit 130c. The second memory array 120b is also connected to two row decoders 140c, 140d. The third row decoder 140c is an even row decoder (that is, decodes even numbered row addresses) while the fourth row decoder 140d is an odd row decoder (that is, decodes odd numbered row addresses) although any configuration of the two row decoders 140c, 140d is possible. A column decoder 102 provides a number of column select signals to the sense amplifier circuits 130. Since the first and second memory arrays 120a, 120b share the second sense amplifier circuit 130b, only one of the arrays 120a, 120b can be accessed at a time. Accordingly, the present invention uses the section select signal SECTION SELECT to ensure that the shared sense amplifier circuit 130b is accessed by only one memory array 120a or 120b at a time. The operation of the DRAM architecture 100 constructed in accordance with the first embodiment of the present invention now follows.

For purposes of illustration only, there are 4 write driver circuits 156a, 156b, write latches 154a, 154b and buffers 152a, 152b and, therefore, 4 data write lines in the data write circuits 150a, 150b. There are also 4 read driver circuits 166a, 166b, pipeline registers 164a, 164b and latches 162a, 162b and, therefore, 4 data read lines in the data read circuits 160a, 160b. The first sense amplifier circuit 130a will have 4 IO pairs connected to the first section select circuit 180a. the second sense amplifier circuit 130b will have 4 IO pairs connected to the first section select circuit 180a and the same 4 IO pairs connected to the second selection circuit 180b. The third sense amplifier circuit 130c will have 4 IO pairs connected to the second section select circuit 180b. Although only one memory array 120a, 120b will be accessed at a time both data path circuits 110a, 110b will be used by the accessed memory array 120a or 120b. That is, all of the available data path circuits 110 will be utilized to either input or output data, but only every other memory array 120 will be accessed. 8 bits of data will be read out of the accessed memory array 120a, for example, during a read operation with 4 data bits traveling to one data path circuit 110a and 4 traveling to another data path circuit 110b. Likewise, 8 bits of data will be written into the accessed memory array 120a, for example, during a write operation with 4 bits of data received from one data path circuit 110a and 4 bits of data received from another data path circuit 110b.

During a read operation, either the first or second row decoders 140a, 140b activate a word line in the first memory array 120a in response to a row address provided by control logic (as illustrated in FIG. 4, the first row decoder 140a activates even row addresses while the second row decoder activates odd row addresses). At this point, the second memory array 120b is not being accessed. The activated word line activates the access transistors for the memory cells of the first memory array 120a that are connected to that word line, allowing the charge stored on the mbit capacitors to discharge onto the digit lines and travel to the first and second sense amplifier circuits 130a, 130b. Four bits (and their complements) travel to the first sense amplifier circuit 130a and four bits (and their complements) travel to the second sense amplifier circuit 130b. Determining which of the 8 bits travel to the first sense amplifier circuit 130a and which travel to the second amplifier circuit 130b is application specific and can be done with any desired scheme. One scheme, for example, would have the four high order bits travel to the first sense amplifier circuit 130a, while the low order bits travel to the second sense amplifier circuit 130b.

The column decoder 102 chooses particular columns by sending two column select signals to the sense amplifier circuits 130a, 130b in response to a column address. The section select signal SECTION SELECT will be set such that the 4 IO pairs from the first sense amplifier circuit 130a will travel to the first data path circuit 110a and the 4 IO pairs from the second sense amplifier circuit 130b will travel to the second data path circuit 110a. Control logic uses the read latch signal READ LATCH to activate the read IO transistors 170a, 170b allowing the IO pairs to enter the read latches 170a, 170b. The latch data is sent through the read pipeline registers 164a, 164b to the read driver circuits 166a, 166b. The read driver circuits 166a, 166b output the data on the data read lines. As is well known in the art, once the data enters the read pipeline registers 164a, 164b, new data may be read from a memory array 120a, 120b without corrupting the data contained in the pipeline registers 164a, 164b. In a preferred embodiment, the next read operation would access the second memory array 120b although it must be noted that the first memory array 120a could be accessed if desired. That is, the memory arrays 120a, 120b could be accessed in an alternating manner, the first memory array 120a followed by the second memory array 120b, or the same array 120a or 120b could be accessed continuously.

During a write operation, data bits from each data write line are written into the data write buffers 152a, 152b of the data path circuits 110a, 110b when the data in trap signal DIN TRAP signal is activated. The data bits are then latched by the write latches 154a, 154b and sent to the write driver circuits 156a, 156b. At this point, the data bits (and their complement) are sent out onto the IO lines 104a, 104b to the section select circuits 180a, 180b by the write driver circuits 156a, 156b.

The section select signal SECTION SELECT will be set such that the 4 IO pairs from the first data path circuit 110a will be sent to either the first or second sense amplifier circuits 130a, 130b and the 4 IO pairs from the second data path circuit 110b will be sent to either the second or third sense amplifier circuits 130b, 130c. As stated above, if the data is to be written into the first memory array 120a, then the section select signal SECTION SELECT will ensure that 4 IO pairs from the first data path circuit 110a will be sent to the first sense amplifier circuit 130a and the 4 IO pairs from the second data path circuit 110b will be sent to the second sense amplifier circuit 130b. Conversely, if the data is to be written into the second memory array 120b, then the section select signal SECTION SELECT will ensure that 4 IO pairs from the first data path circuit 110a will be sent to the second sense amplifier circuit 130b and the 4 IO pairs from the second data path circuit 110b will be sent to the third sense amplifier circuit 130c. The column select signals and the row decoders 140 activate the appropriate locations within the memory arrays 120a or 120b and, thus, allowing the data bits to be written from the sense amplifiers circuits into the appropriate memory array 120a, 120b.

Figure 5:
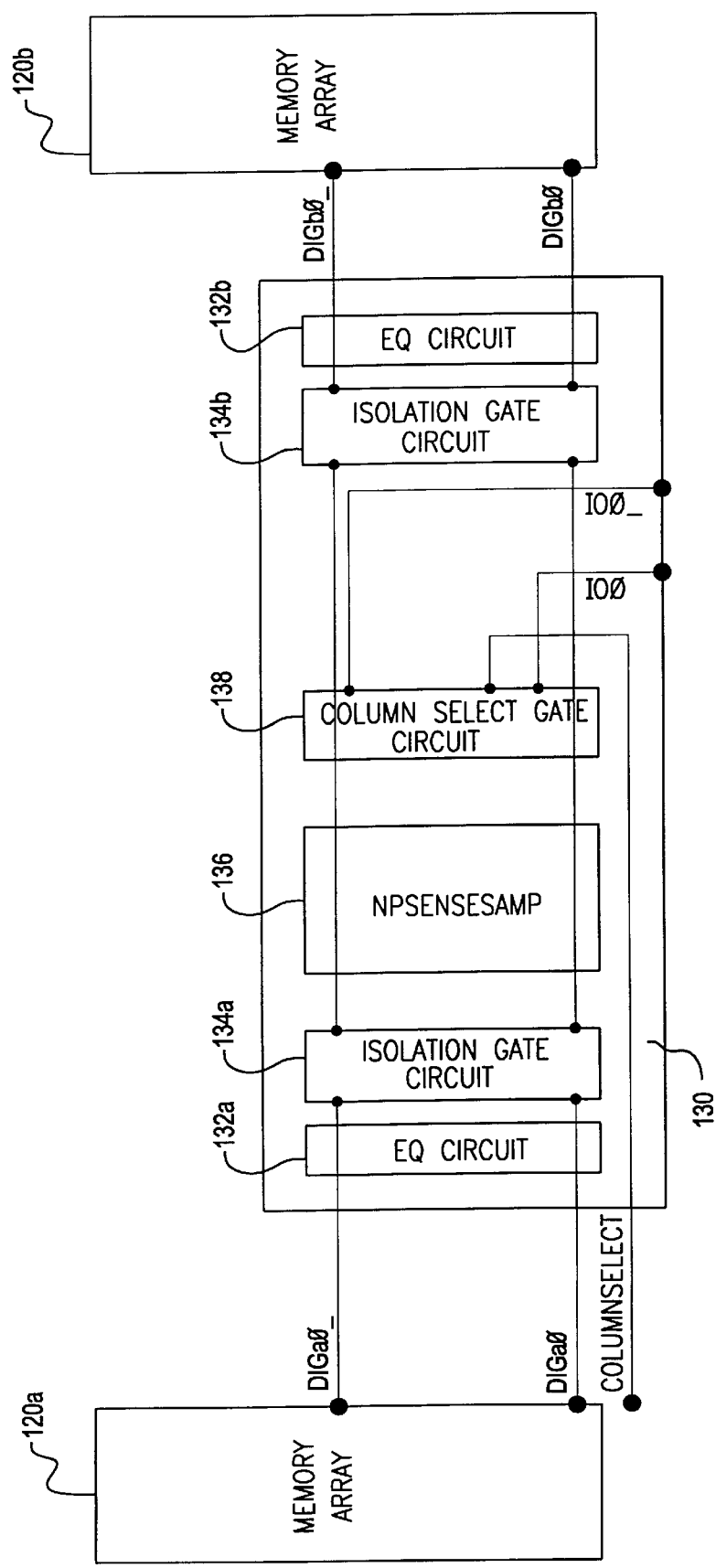

FIG. 5 illustrates the contents of a sense amplifier circuit 130 and the various connections between the elements within the circuit 130. The sense amplifier circuit 130 contains two equalizer circuits 132a, 132b, two isolation gate circuits 134a, 134b, a sense amplifier 136 and a column select gate circuit 138.

The first equalizer circuit 132a is connected to the first memory array 120a through a digit line pair DIGa0, DIGa0_. The first equalizer circuit 132*a* is used to ensure a correct voltage level on the digit line pair DIGa0, DIGa0_ when data is traveling into, or out of; the sense amplifier circuit 130*b*. The first isolation gate circuit 134*a* is used to isolate the digit line pair DIGa0, DIGa0_ from the sense amplifier 136 when data is to travel between the second memory array 120*b* and the sense amplifier 136.

The second equalizer circuit 132*b* is connected to the second memory array 120*b* through a digit line pair DIGb0, DIGb0_. The second equalizer circuit 132*b* is used to ensure a correct voltage level on the digit line pair DIGb0, DIGb0_ when data is traveling into, or out of; the sense amplifier circuit 130*b*. The second isolation gate circuit 134*b* is used to isolate the digit line pair DIGb0, DIGb0_ from the sense amplifier 136 when data is to travel between the first memory array 120*a* and the sense amplifier 136.

The sense amplifier circuit 136 is connected to the two isolation circuits 134*a*, 134*b* and to the column select gate circuit 138. For a read operation, the column select signal causes the column select gate circuit 138 to allow the signals from the appropriate digit line pair DIGa0, DIGa0_ or DIGb0 or DIGb0_ to be dumped onto the IO pair IO0, IO0_. For a write operation, the column select signal causes the column select gate circuit 138 to allow the signals from the IO pair IO0, IO0_ to be dumped onto the appropriate digit line pair DIGa0, DIGa0_ or DIGb0 or DIGb0_.

Figure 6:
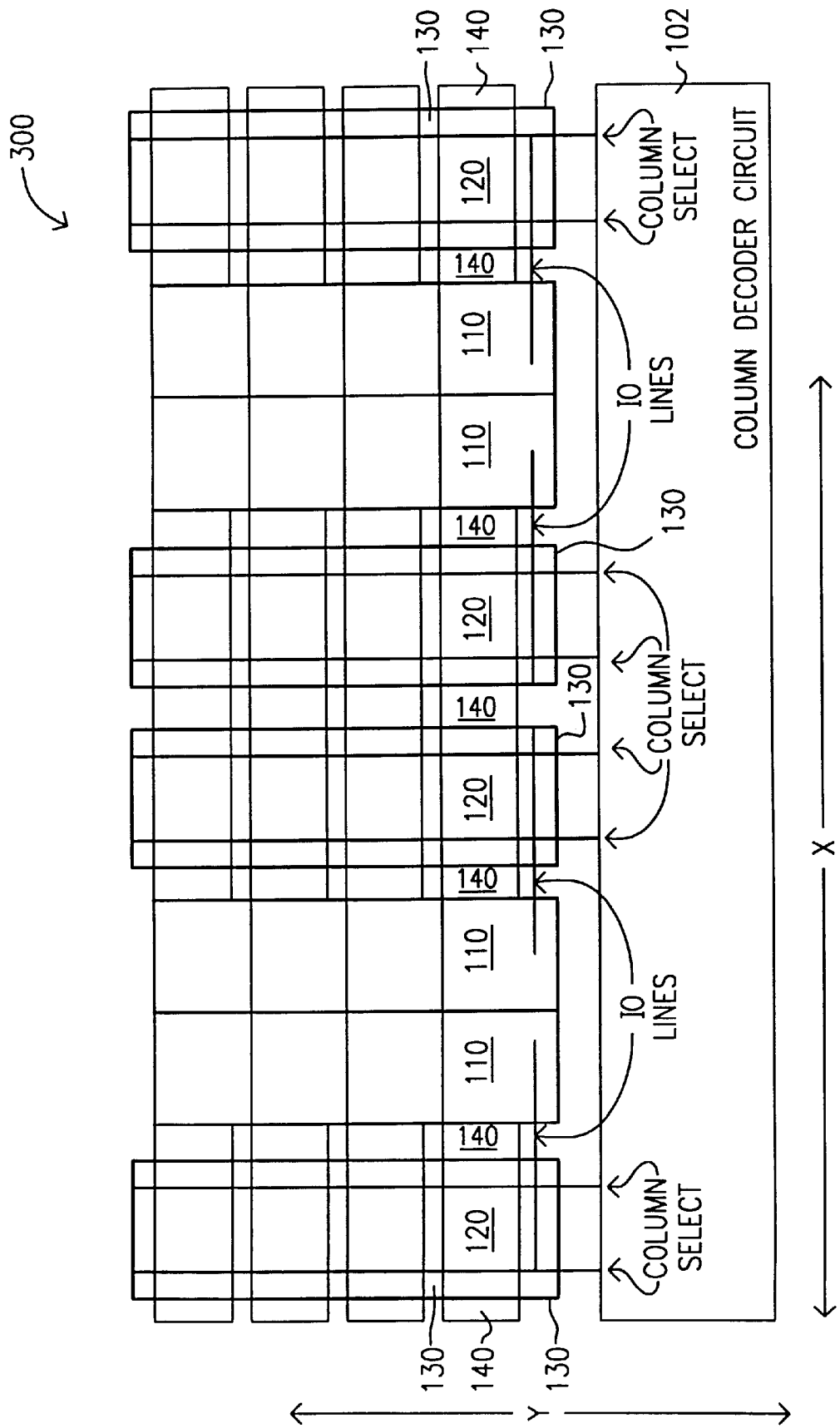
FIGS. 6–7 are block diagrams of embedded DRAM circuits constructed in accordance with a first embodiment of the present invention.

Using this unique arrangement of data path circuits 110, memory arrays 120, row decoders 140 and sense amplifier circuits 130 as a building block, a DRAM architecture 100 of increased capacity can be constructed by simply placing additional such building blocks onto the semiconductor device in a y-direction. In addition, if the application warrants, additional building blocks can also be placed onto the semiconductor substrate in the x-direction as well. FIG. 6 illustrates an example of one possible architecture of an embedded DRAM circuit 300 constructed in accordance with the present invention. In this example, 16 data path circuits 110 and 16 memory arrays 120 (and appropriate number of row decoders 140 and sense amplifier circuits 130) are arranged such that there are 4 columns of data path circuits 110 (x-direction), each column having 4 data path circuits 110 arranged in the y-direction. With each of the memory arrays 120 having a size of 64 k, and each data path circuit 110 having, 4 data read lines and 4 data write lines, for example, the DRAM circuit 300 contains over 1 Meg of memory cells and 64 data read lines and 64 data write lines.

With the architecture of the present invention, the mbits and IO lines are isolated. Mbits are isolated by the column select lines residing in the second layer of metal (metal 2). Accordingly, the third and fourth metal layers (i.e., metal3 and metal4) can be routed over the DRAM memory arrays 120. Prior art architectures use the second layer of metal (metal2) for the IO lines. Since the IO line, are noise sensitive, no routing can be placed over the DRAM memory arrays 120.

Figure 7:
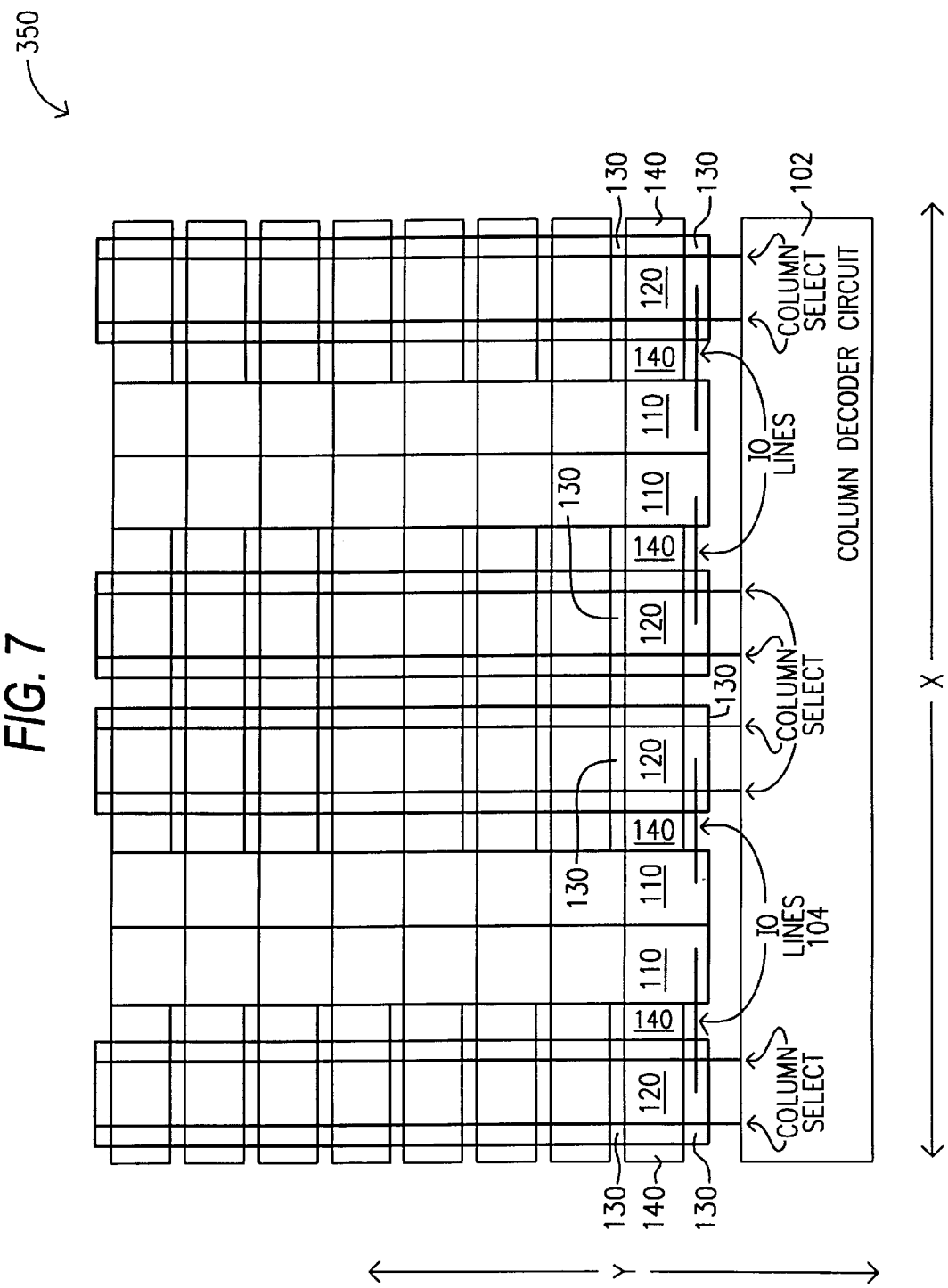

FIG. 7 illustrates another exemplary architecture of an embedded DRAM circuit 350 constructed in accordance with the present invention. In this example, 32 data path circuits 110 and 32 memory arrays 120 (and appropriate number of row decoders 140 and sense amplifier circuits 130) are arranged such that there are 4 columns of data path circuits 110 (x-direction), each column having 8 data path circuits 110 arranged in the y-direction. With each of the memory arrays 120 having a size of 64 k and each data path circuit 100 having 4 data read lines and 4 data write lines, for example, the DRAM circuit 351) contains over 2 Meg of memory cells and 128 data read lines and 128 data write lines.

Figure 8:
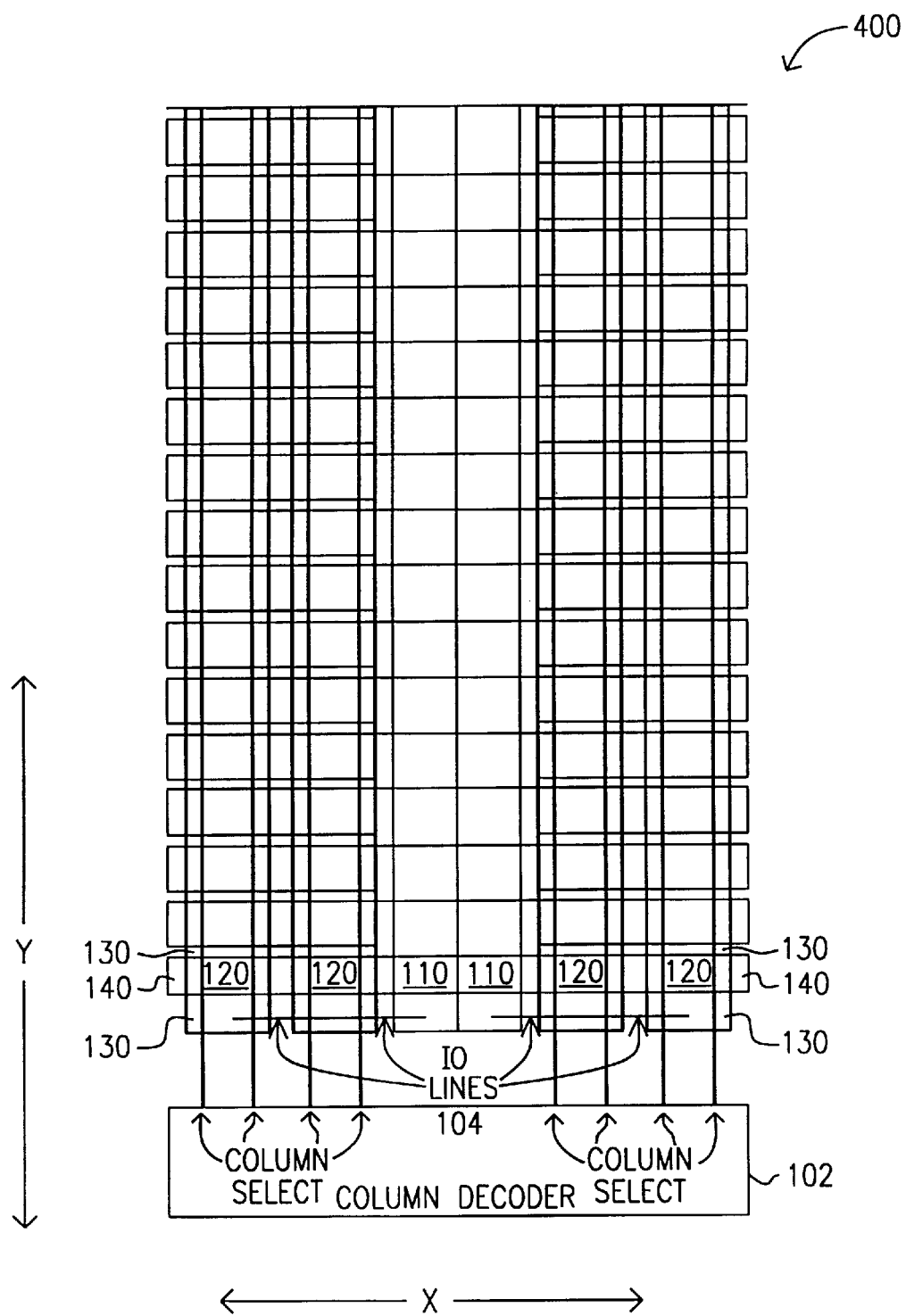
FIG. 8 is a block diagram of an embedded DRAM circuit constructed in accordance with a second embodiment of the present invention.

FIG. 8 illustrates an example architecture of an embedded DRAM circuit 400 constructed in accordance with a second embodiment of the present invention. In this embodiment, there are two memory arrays 120 associated with a data path circuit 110. In this embodiment, if each data path circuit 110 has 4 data read lines and 4 data write lines, each accessed memory array 120 outputs 2 bits of data to one data path circuit 110 outputs 2 bits of data to the other data path circuit 110 for a total of 4 bits per memory array 120 (contrast to the architectures in FIGS. 3 to 7 where 8 bits per accessed memory array 120 were output). Otherwise, the operation of the circuit 400 is exactly the same as the circuits described above with reference to FIGS. 3–7. It must be noted, that it is possible to configure the circuit 400 such that only one memory array 120 is accessed and the accessed array 120 outputs 8 bits of data. In this example, 32 data path circuits 110 and 64 memory arrays 120 (and appropriate number of row decoders 140 and sense amplifier circuits 130) are arranged such that there are 2 columns of data path circuits 110 (x-direction), each column having 16 data path circuits 110 arranged in the y-direction. With each of the memory arrays 120 having a size of 64 k and the data path circuits 110 having 4 data read lines and 4 data write lines, for example, the DRAM circuit 400 contains over 4 Meg of memory cells and 128 data read lines and 128 data write lines.

Figure 9:
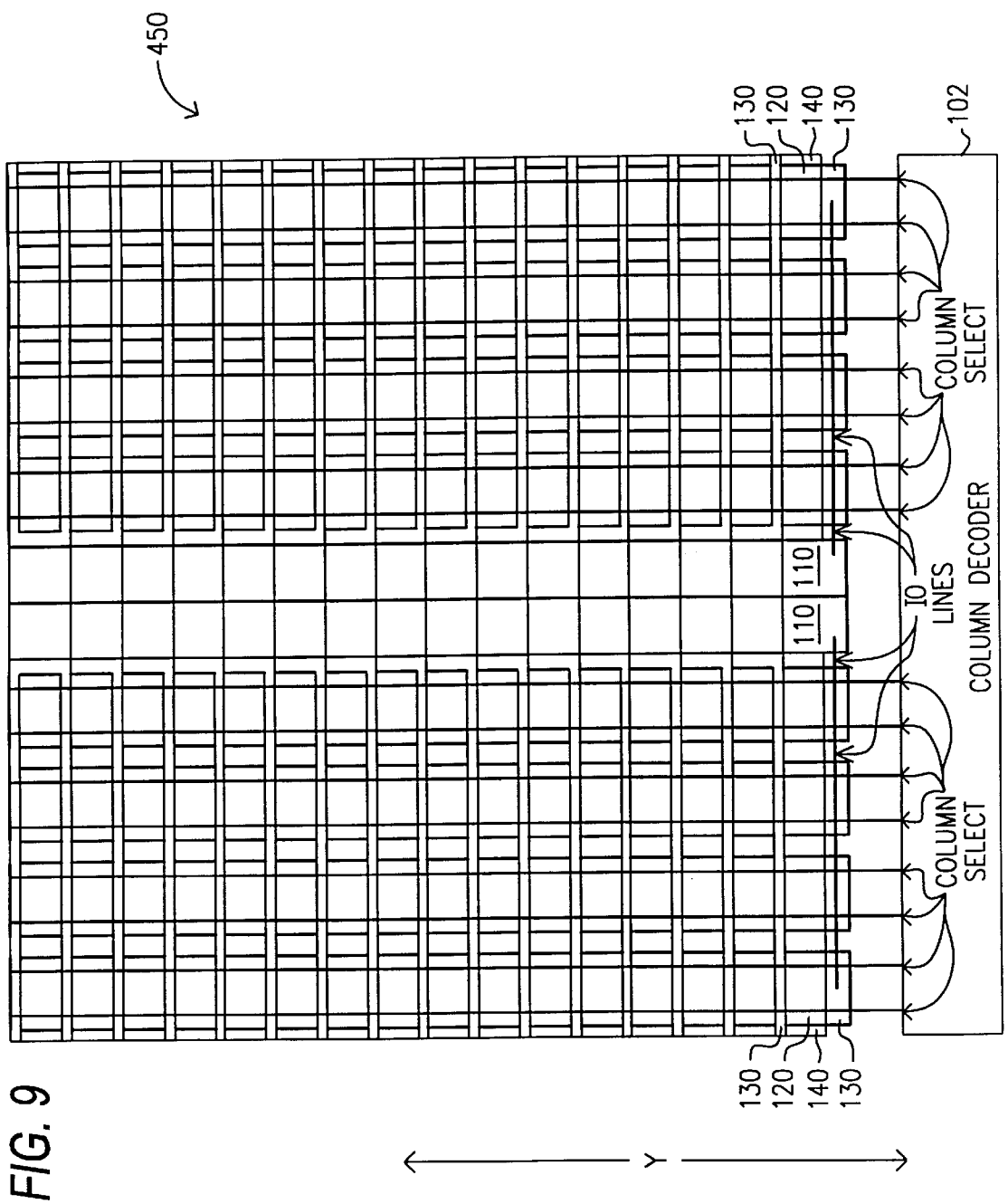
FIG. 9 is a block diagram of an embedded SGRAM circuit constructed in accordance with a third embodiment of the present invention.

FIG. 9 illustrates an example architecture of an embedded SGRAM circuit 450 constructed in accordance with a third embodiment of the present invention. In this embodiment, there are four memory arrays 120 associated with a data path circuit 110. In this embodiment, if each data path circuit 110 has 4 data read lines and 4 data write lines, each accessed memory array 120 outputs 1 bit of data to one data path circuit 110 and outputs 1 bit of data to the other data path circuit 110 for a total of 2 bits per memory array 120 (contrast to the architectures in FIGS. 3 to 7 where 8 bits per accessed memory array 120 were output). Otherwise, the operation of the circuit 450 is exactly the same as the circuits described above with reference to FIGS. 3–7. It must be noted, that it is possible to configure the circuit 450 such that only one memory array 120 is accessed and the accessed array 120 outputs 8 bits of data. In this example, 32 data path circuits 110 and 128 memory arrays 120 (and appropriate number of row decoders 140 and sense amplifier circuits 130) are arranged such that there are 2 columns of data path circuits 110 (x-direction), each column having 16 data path circuits 110 arranged in the y-direction. With each of the memory arrays 120 having a size of 64 k and each data path circuit 110 having 4 data read lines and 4 data write lines, for example, the DRAM circuit 450 contains over 8 Meg of memory cells and 128 data read lines and 128 data write lines.

FIG. 10 illustrates a computer system 800 including a logical device 820, such his a graphics accelerator, comprising a processor 822 and an embedded DRAM circuit 824 constructed in accordance with the present invention. The processor 822 of the device 820 performs a logical function for the computer system 800 and the DRAM 824 of the logical device 820 operates as described with reference to FIGS. 5 and 6. The computer system 800 also includes a central processing unit (CPU) 802 that communicates to the logical device 820 and an I/O device 804 over a bus 816. A second I/O device 806 is illustrated, but is not necessary to practice the invention. The computer system also include, RAM 808, read only memory (ROM) 810 and may include peripheral devices such as a floppy disk drive 812 and a compact disk (CD) drive 814 that also communicate with the CPU 802 over the bus 816 as is well known in the art. RAM 808 may also, if desired incorporate the present invention.

Figure 2:
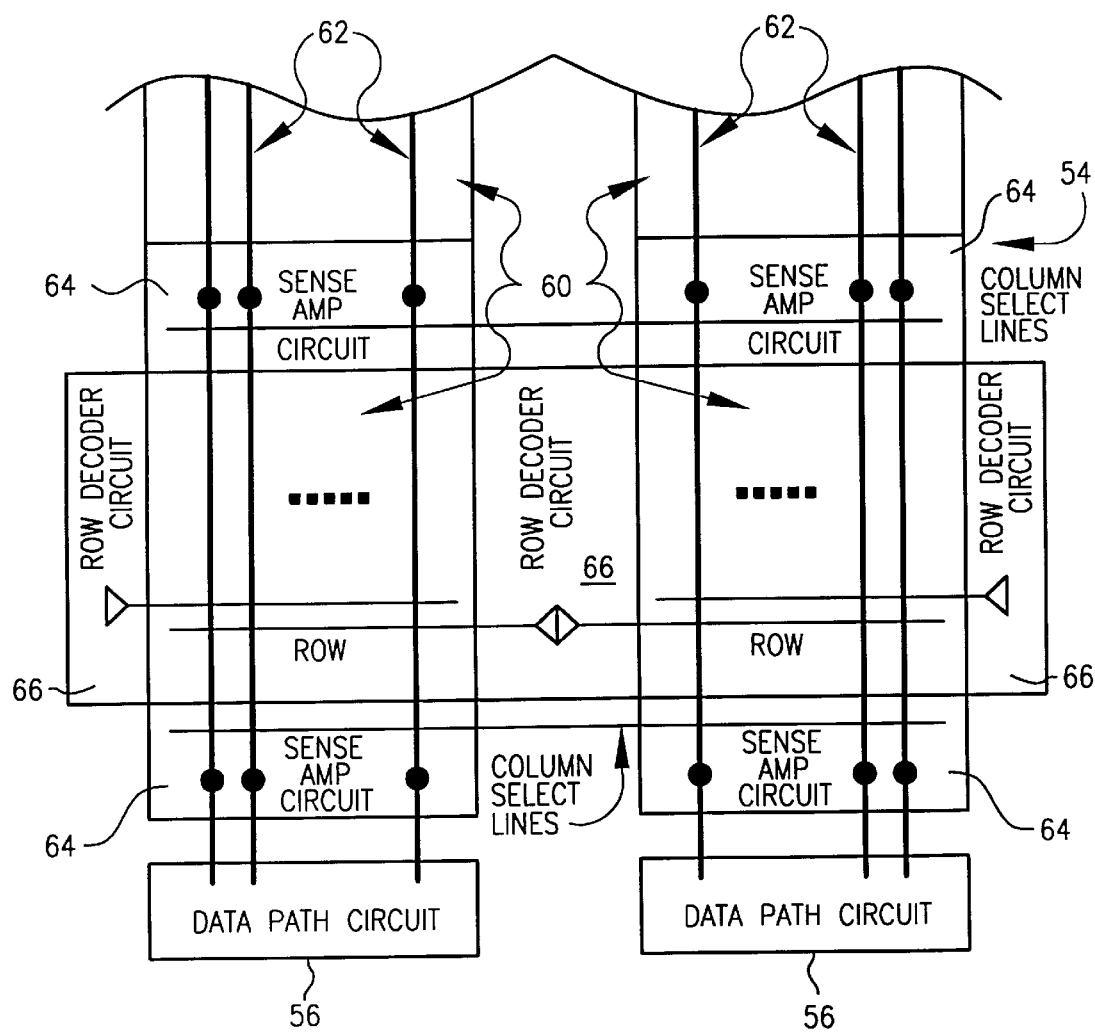
FIG. 2 is a block diagram of the prior art embedded DRAM circuit.

A description of how conventional address compression testing can be utilized in testing the embedded DRAM of the present invention now follows. Although the test would be the same for any of the aforementioned circuits, for convenience purposes the test will be described with reference to the DRAM circuit 300 of FIG. 6. Address compression is accomplished by treating certain addresses as "don't care" address locations. Since the DRAM circuit 300 is comprised of 16 data path circuits 110 and 16 memory arrays 120, it is possible to access memory locations in 8 memory arrays 120 with one test address. These locations correspond to specific data read lines are compared together with a special compare circuit. The compare circuit determines if the data from each address, location is the same. If they are not the same, at least one of the address locations is defective. Due to the layout of the prior art DRAM circuit 54 (FIG. 2) only 1 address location can be tested at time. Accordingly, the memory test for the DRAM circuit 300 of the present invention would run 8 times as fast as the prior art circuit 54.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is .not limited by the foregoing description, but is only limited by the scope of the appended claims.

What is claimed as new and desired to be protected by Letters Patent of the United States is:

1. A memory device comprising:
    a first pair of data path circuits, wherein each of the data path circuits comprises a data write circuit, a data read circuit and a section select circuit, arranged adjacent to each other in a first direction; and
    at least one block of memory cells connected to each data path circuit of said first pair of data path circuits and arranged in said first direction with respect to said first pair of data path circuits such that said first pair of data path circuits is located between said block of memory cells, said memory cells of each of said blocks being organized into an array having rows and columns.

2. The memory device of claim 1 wherein each of said data path circuits is associated with and positioned adjacent to two of said blocks of memory in said first direction, both of said blocks of memory being on a same side of an associated data path circuit.

3. The memory device of claim 2 wherein each of said data path circuits are associated with at least another two of said blocks of memory in a second direction.

4. The memory device of claim 1 wherein each of said data path circuits is associated with and positioned adjacent to four of said blocks of memory in said first direction, all four of said blocks of memory being on a same side of an associated data path circuit.

5. The memory device of claim 4 wherein each of said data path circuits are associated with at least another four of said blocks of memory in a second direction.

6. The memory device of claim 1 further comprising:
    at least a second pair of data path circuits arranged adjacent to each other in said first direction; and
    at least one block of memory cells connected to each of said second pair of data path circuits in said first direction, each of said block of memory cells comprising:
        a plurality of word lines, each of said word lines being respectively connected to a row of memory cells of said block;
        a plurality of digit lines, each of said digit lines being respectively connected to a column of memory cells of said block;
        at least one row decoder, each of said row decoders connected to said word lines of said block; and
        a plurality of sense amplifier circuits for reading data from and writing data to said memory cells, said sense amplifier circuits being respectively connected to said digit lines of said block, said sense amplifier circuits having a plurality of data transferring lines for transferring data between a respective one of said data path circuits and said sense amplifier circuits;
    said second pair of data path circuits and their associated blocks of memory cells being arranged in a second direction orthogonal to said first direction with respect to said first pair of data path circuits and their associated blocks of memory cells.

7. The memory device of claim 6 further comprising a selection circuit for selectively coupling sense amplifier circuits from adjacent blocks of memory arranged in said second direction to a data path circuit associated with one of said adjacent blocks, said associated data path circuits reading data from or writing data to a selected one of said adjacent blocks.

8. The memory device of claim 7 wherein each data path circuit comprises:
    a plurality of write driver circuits connectable to said sense amplifier circuits, each of said write driver circuits having a data write line for inputting data into said sense amplifier circuits; and
    a plurality of read driver circuits connectable to said sense amplifier circuits, each of said read driver circuits having a data read line for outputting data from said sense amplifier circuits.

9. The memory device of claim 7 wherein each block of memory cells includes two row decoders located on opposite sides of said block, said row decoders respectively activating alternate word lines within a block.

10. The memory device of claim 1 wherein each of said blocks of memory comprise at least 64K memory cells.

11. The memory device of claim 1 wherein each of said blocks of memory comprise at least 128K memory cells.

12. The memory device of claim 1 wherein each of said blocks of memory comprise at least 256K memory cells.

13. The memory device of claim 1 wherein each of said blocks of memory comprise at least 512K memory cells.

14. The memory device of claim 1 wherein each of said blocks of memory comprise at least 1024K memory cells.

15. A memory circuit comprising:
    at least one memory module residing on a semiconductor device, each of said memory modules comprising:
        a first pair of data path circuits, wherein each of the data path circuits comprises a data write circuit, a data read circuit and a section select circuit, arranged adjacent to each other in a first direction; and
        at least one block of memory cells connected to each data path circuit of said first pair of data path circuits and arranged in said first direction with respect to said first pair of data path circuits such that said first pair of data path circuits is located between said block of memory cells, said memory cells of each of said blocks being organized into an array having rows and columns; and
    a column decoder, said column decoder connected to sense amplifier circuitry of said memory module.

16. The memory circuit of claim 15 wherein each of said data path circuits is associated with and positioned adjacent to two of said blocks of memory in said first direction, both of said blocks of memory being on a same side of an associated data path circuit.

17. The memory circuit of claim 16 wherein each of said data path circuits are associated with at least another two of said blocks of memory in a second direction.

18. The memory circuit of claim 15 wherein each of said data path circuits is associated with and positioned adjacent to four of said blocks of memory in said first direction, all four of said blocks of memory being on a same side of an associated data path circuit.

19. The memory circuit of claim 18 wherein each of said data path circuits are associated with at least another four of said blocks of memory in a second direction.

20. The memory circuit of claim 15 wherein said memory modules further comprise:
   at least a second pair of data path circuits arranged adjacent to each other in said first direction; and
   at least one block of memory cells connected to each of said second pair of data path circuits in said first direction, each of said block of memory cells comprising:
      a plurality of word lines, each of said word lines being respectively connected to a row of memory cells of said block;
      a plurality of digit lines, each of said digit lines being respectively connected to a column of memory cells of said block;
      at least one row decoder, each of said row decoders connected to said word lines of said block; and
      a plurality of sense amplifier circuits for reading data from and writing data to said memory cells, said sense amplifier circuits being respectively connected to said digit lines of said block, said sense amplifier circuits having a plurality of data transferring lines for transferring data between a respective one of said data path circuits and said sense amplifier circuits;
   said second pair of data path circuits and their associated blocks of memory cells being arranged in a second direction orthogonal to said first direction with respect to said first pair of data path circuits and their associated blocks of memory cells.

21. The memory circuit of claim 20 wherein said memory module further comprises a selection circuit for selectively coupling sense amplifier circuits from adjacent blocks of memory arranged in said second direction to a data path circuit associated with one of said adjacent blocks, said associated data path circuits reading data from or writing data to a selected one of said adjacent blocks.

22. The memory circuit of claim 20 wherein each data path circuit comprises:
   a plurality of write driver circuits connectable to said sense amplifier circuits, each of said write driver circuits having a data write line for inputting data into said sense amplifier circuits; and
   a plurality of read driver circuits connectable to said sense amplifier circuits, each of said read driver circuits having a data read line for outputting data from said sense amplifier circuits.

23. The memory circuit of claim 20 wherein each block of memory cells includes two row decoders located on opposite sides of said block, said row decoders respectively activating alternate word lines within said block.

24. The memory circuit of claim 15 wherein sense amplifier circuitry of at least two memory modules are connected to said column decoder and are positioned on the semiconductor device in a second direction orthogonal to a first direction.

25. The memory circuit of claim 15 wherein sense amplifier circuitry of at least four memory modules are connected to said column decoder and are positioned on the semiconductor device in a second direction orthogonal to a first direction.

26. The memory circuit of claim 25 wherein said at least four memory modules are configured into two columns in a first direction.

27. The memory circuit of claim 15 wherein sense amplifier circuitry of at least eight memory modules are connected to said column decoder and are positioned on the semiconductor device in a second direction orthogonal to a first direction.

28. The memory circuit of claim 27 wherein said at least eight memory modules are configured into two columns in a first direction.

29. The memory circuit of claim 15 wherein said memory circuit is an SGRAM memory circuit.

30. The memory circuit of claim 15 wherein said memory circuit is a DRAM memory circuit.

31. The memory circuit of claim 15 wherein said memory circuit is a RAM memory circuit.

32. The memory circuit of claim 15 wherein each of said blocks of memory comprise at least 64K memory cells.

33. The memory circuit of claim 15 wherein each of said blocks of memory comprise at least 128K memory cells.

34. The memory circuit of claim 15 wherein each of said blocks of memory comprise at least 256K memory cells.

35. The memory circuit of claim 15 wherein each of said blocks of memory comprise at least 512K memory cells.

36. The memory circuit of claim 15 wherein each of said blocks of memory comprise at least 1024K memory cells.

37. A computer system comprising:
   a processor; and
   a semiconductor device connected to said processor, said semiconductor device comprised of memory modules having sense amplifier circuitry connected to a column decoder, each of said memory modules comprising:
      a first pair of data path circuits, wherein each of the data path circuits comprises a data write circuit, a data read circuit and a section select circuit, arranged adjacent to each other in a first direction; and
      at least one block of memory cells connected to each data path circuit of said first pair of data path circuits and arranged in said first direction with respect to said first pair of data path circuits such that said first pair of data path circuits is located between said block of memory cells, said memory cells of each of said blocks being organized into an array having rows and columns.

38. The system of claim 37 wherein each of said data path circuits is associated with and positioned adjacent to two of said blocks of memory in said first direction, both of said blocks of memory being on a same side of an associated data path circuit.

39. The system of claim 38 wherein each of said data path circuits are associated with at least another two of said blocks of memory in a second direction.

40. The system of claim 37 wherein each of said data path circuits is associated with and positioned adjacent to four of said blocks of memory in said first direction, all four of said blocks of memory being on a same side of an associated data path circuit.

41. The system of claim 40 wherein each of said data path circuits are associated with at least another four of said blocks of memory in a second direction.

42. The system of claim 37 wherein said memory modules further comprise:
   at least a second pair of data path circuits arranged adjacent to each other in said first direction; and
   at least one block of memory cells connected to each of said second pair of data path circuits in said first direction, each of said block of memory cells comprising:
      a plurality of word lines, each of said word lines being respectively connected to a row of memory cells of said block;
      a plurality of digit lines, each of said digit lines being respectively connected to a column of memory cells of said block;
      at least one row decoder, each of said row decoders connected to said word lines of said block; and
      a plurality of sense amplifier circuits for reading data from and writing data to said memory cells, said sense amplifier circuits being respectively connected to said digit lines of said block, said sense amplifier circuits having a plurality of data transferring lines for transferring data between a respective one of said data path circuits and said sense amplifier circuits;
   said second pair of data path circuits and their associated blocks of memory cells being arranged in a second direction orthogonal to said first direction with respect to said first pair of data path circuits and their associated blocks of memory cells.

43. The system of claim 42 wherein said memory module further comprises a selection circuit for selectively coupling sense amplifier circuits from adjacent blocks of memory arranged in said second direction to a data path circuit associated with one of said adjacent blocks, said associated data path circuits reading data from or writing data to a selected one of said adjacent blocks.

44. The system of claim 42 wherein each data path circuit comprises:
   a plurality of write driver circuits connectable to said sense amplifier circuits, each of said write driver circuits having a data write line for inputting data into said sense amplifier circuits; and
   a plurality of read driver circuits connectable to said sense amplifier circuits, each of said read driver circuits having a data read line for outputting data from said sense amplifier circuits.

45. The system of claim 42 wherein each block of memory cells includes two, row decoders located on opposite sides of said block, said row decoders respectively activating alternate word lines within said block.

46. The system of claim 37 wherein sense amplifier circuitry of at least two memory modules are connected to said column decoder and are positioned on the semiconductor device in a second direction orthogonal to a first direction.

47. The system of claim 37 wherein sense amplifier circuitry of at least four memory modules are connected to said column decoder and are positioned on the semiconductor device in a second direction orthogonal to a first direction.

48. The system of claim 47 wherein said at least four memory modules are configured into two columns in a first direction.

49. The system of claim 37 wherein sense amplifier circuitry of at least eight memory modules are connected to said column decoder and are positioned on the semiconductor device in a second direction orthogonal to a first direction.

50. The system of claim 49 wherein said at least eight memory modules are configured into two columns in a first direction.

51. The system of claim 37 wherein said semiconductor device is an SGRAM memory circuit.

52. The system of claim 37 wherein said semiconductor device is a DRAM memory circuit.

53. The system of claim 37 wherein said semiconductor device is a RAM memory circuit.

54. The system of claim 37 wherein each of said blocks of memory comprise at least 64K memory cells.

55. The system of claim 37 wherein each of said blocks of memory comprise at least 128K memory cells.

56. The system of claim 37 wherein each of said blocks of memory comprise at least 256K memory cells.

57. The system of claim 37 wherein each of said blocks of memory comprise at least 512K memory cells.

58. The system of claim 37 wherein each of said blocks of memory comprise at least 1024K memory cells.

59. A method of operating a memory circuit having at least a first and second array of memory cells and a first data path circuit, each of said arrays being connected to said first data path circuit, said method comprising:
   activating one of a plurality of first word lines connected to a row of memory cells in said first array of memory cells associated with and connected to said first data path circuit;
   activating a plurality of first digit lines connected to a column of memory cells in said first array having one of said first word lines activated;
   transferring data between memory cells associated with and connected to said activated first word line and first digit line and said first data path circuit;
   activating one of a plurality of second word lines connected to a row of memory cells in said second array associated with and connected to said first data path circuit;
   activating a plurality of second digit lines connected to a column of memory cells in said second array having one of said second word lines activated;
   transferring data between memory cells associated with and connected to said activated second word line and second digit line of said second array and said first data path circuit; and
   wherein said transfer of data between memory cells of said first and second arrays and said first data path circuit is selectively performed by only one of said first and second arrays at a time.

60. The method according to claim 59 wherein said memory circuit contains a second data path circuit, said first and second arrays being connected to said second data path circuit, said method further comprises the steps of:
   activating one of a plurality of first word lines connected to a row of memory cells in said first array of memory cells associated with and connected to said second data path circuit;
   activating a plurality of first digit lines connected to a column of memory cells in said first array having one of said first word lines activated; and
   transferring data between memory cells associated with and connected to said activated first word line and first digit line and said second data path circuit.

61. The method according to claim 59 wherein said memory circuit contains a second data path circuit, said first and second arrays being connected to said second data path circuit, said method further comprises the steps of:

activating one of a plurality of second word lines connected to a row of memory cells in said second array of memory cells associated with and connected to said second data path circuit;

activating a plurality of second digit lines connected to a column of memory cells in said second array having one of said second word lines activated; and transferring data between memory cells associated with and connected to said activated second word line and second digit line and said second data path circuit.

62. A method of manufacturing a memory circuit comprising the steps of:

providing a first pair of data path circuits, wherein each of the data path circuits comprises a data write circuit, a data read circuit and a section select circuit, arranged adjacent to each other in a first direction;

providing al least one block of memory cells connected to each data path circuit of said first pair of data path circuits and arranged in said first direction with respect to said first pair of data path circuits such that said first pair of data path circuits is located between said block of memory cells, said memory cells of each of said blocks being organized into in array having rows and columns; and providing a column decoder, connected to sense amplifier circuitry of said blocks of memory.

63. The method of claim 62 wherein each of said data path circuits is associated with and positioned adjacent to two of said blocks of memory in said first direction, both of said blocks of memory being on a same side of an associated data path circuit.

64. The method of claim 63 wherein each of said data path circuits are associated with at least another two of said blocks of memory in a second direction.

65. The method of claim 62 wherein each of said data path circuits is associated With and positioned adjacent to four of said blocks of memory in said first direction, all four of said blocks of memory being on a same side of an associated data path circuit.

66. The method of claim 65 wherein each of said data path circuits are associated with at least another four of said blocks of memory in a second direction.

67. The method of claim 62 further comprising:

providing at least a second pair of data path circuits arranged adjacent to each other in said first direction; and providing at least one block of memory cells connected to each of said second pair of data path circuits in said first direction, each of said block of memory cells comprising:

a plurality of word lines, each of said word lines being respectively connected to a row of memory cells of said block;

a plurality of digit lines, each of said digit lines being respectively connected to a column of memory cells of said block;

at least one row decoder, each of said row decoders connected to said word lines of said block; and a plurality of sense amplifier circuits for reading data from and writing data to said memory cells, said sense amplifier circuits being respectively connected to said digit lines of said block, said sense amplifier circuits having a plurality of data transferring lines for transferring data between a respective one of said data path circuits and said sense amplifier circuits;

said second pair of data path circuits and their associated blocks of memory cells being arranged in a second direction orthogonal to said first direction with respect to said first pair of data path circuits and their associated blocks of memory cells.

68. The method of claim 67 wherein further comprising the step of providing a selection circuit for selectively coupling sense amplifier circuits from adjacent blocks of memory arranged in said second direction to a data path circuit associated with one of said adjacent blocks, said associated data path circuits reading data from or writing data to a selected one of said adjacent blocks.

69. The method of claim 67 wherein the step of providing said at least a second pair of data path circuit comprises:

providing a plurality of write driver circuits connectable to said sense amplifier circuits, each of said write driver circuits having a data write line for inputting data into said sense amplifier circuits; and providing a plurality of read driver circuits connectable to said sense amplifier circuits, each of said read driver circuits having a data read line for outputting data from said sense amplifier circuits.

70. The memory circuit of claim 67 wherein each block of memory cells includes two row decoders located on opposite sides of said block, said row decoders respectively activating alternate word lines within said block.

* * * * *

UNITED STATES PATENT AND TRADEMARK OFFICE
CERTIFICATE OF CORRECTION

PATENT NO. : 6,141,286
DATED : October 31, 2000
INVENTOR(S) : Huy T. Vo et al.

It is certified that error appears in the above-identified patent and that said Letters Patent is hereby corrected as shown below:

COLUMN 7:

Line 31, "the" should read --The--.

COLUMN 9:

Line 66, "351)" should read --350--.

COLUMN 10:

Line 55, "such his a" should read --such has a--.

Line 65, "include," should read --includes--.

Signed and Sealed this

Eighth Day of May, 2001

Attest:

NICHOLAS P. GODICI

Attesting Officer   Acting Director of the United States Patent and Trademark Office